(12) United States Patent
Wu et al.

(10) Patent No.: US 10,015,907 B2
(45) Date of Patent: Jul. 3, 2018

(54) HEAT DISSIPATING DEVICE

(71) Applicant: Amulaire thermal technology, INC., New Taipei (TW)

(72) Inventors: Chun-Lung Wu, New Taipei (TW); Ming-Sian Lin, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 26 days.

(21) Appl. No.: 15/078,015

(22) Filed: Mar. 23, 2016

(65) Prior Publication Data

US 2017/0280588 A1    Sep. 28, 2017

(51) Int. Cl.
*F28F 7/00* (2006.01)
*H05K 7/20* (2006.01)

(52) U.S. Cl.
CPC .............................. *H05K 7/20254* (2013.01)

(58) Field of Classification Search
CPC ...... H05K 7/20254; F28F 13/12; F28F 13/08; F28F 3/044
See application file for complete search history.

(56) References Cited

U.S. PATENT DOCUMENTS

| | | | | | |
|---|---|---|---|---|---|
| 4,620,216 | A | * | 10/1986 | Horvath | H01L 23/367 257/713 |
| 4,899,210 | A | * | 2/1990 | Lorenzetti | H01L 23/367 257/712 |
| 5,781,411 | A | * | 7/1998 | Feenstra | H01L 23/3677 165/80.3 |
| 6,462,945 | B2 | * | 10/2002 | Sloan | H01L 23/4093 165/80.3 |
| 6,590,770 | B1 | * | 7/2003 | Rogers | H01L 23/3672 165/121 |
| 7,357,173 | B2 | * | 4/2008 | Griesmayer | H01L 23/3677 165/80.3 |
| D613,258 | S | * | 4/2010 | Walker | D13/179 |
| 8,837,164 | B2 | * | 9/2014 | Kawabata | H01L 23/3675 174/559 |

* cited by examiner

*Primary Examiner* — Len Tran
*Assistant Examiner* — Gordon Jones
(74) *Attorney, Agent, or Firm* — Li & Cai Intellectual Property (USA) Office

(57) ABSTRACT

A heat dissipating device includes a thermal conductive substance, a plurality of heat-radiating protrusions and a plurality of turbulence-generating structures. The thermal conductive substance has a first surface and a second surface opposite to the first surface. The heat-radiating protrusions are integrally formed with the thermal conductive substance on the first surface. At least one of the turbulence-generating structures is formed on the first surface of the thermal conductive substance in concaved manner, and arranged around a bottom periphery of the heat-radiating protrusions, so as to obstruct a development of a boundary layer around the bottom of the heat-radiating protrusions.

8 Claims, 5 Drawing Sheets

HEAT DISSIPATING DEVICE

BACKGROUND OF THE INVENTION

1. Field of the Disclosure

The instant disclosure is related to a heat dissipating device. In particular, the instant disclosure relates to a heat dissipating device for dissipating heat, which can be applied on, for example, a water-cooled type dissipating device.

2. Description of Related Art

A heat dissipating device is widely used to dissipate redundant heat of an electrical element. A conventional heat dissipating device usually includes a substrate, and a plurality of fins connected to an upper surface of the substrate. The substrate is contacted with a heat source, such as an electrical element.

A conventional heat dissipating device allows working fluid, such as air or liquid, to flow through the fins, so as to dissipate heat outside. However, a boundary layer with a thicker depth may happen on some portions of the conventional heat dissipating device, which will cause a problem of heat resistance. If a heat boundary layer happens on a periphery of the fins, a distance to move a hot working fluid to a cooler environment will become longer, when the heat boundary layer becomes thicker. In other words, the depth of the heat boundary layer is thicker, and the dissipation of heat is more difficult.

SUMMARY OF THE INVENTION

One objective of the instant disclosure is to provide a heat dissipating device, which mixes a working fluid more thoroughly by obstructing a forming of a boundary layer to reduce a depth of the boundary layer, so that an object is easily cooled. In addition, another objective of the instant disclosure is to reduce a total weight of the heat dissipating device, so that a material cost can be lowered.

In order to achieve the above objectives, according to one exemplary embodiment of the instant disclosure, the instant disclosure provides a heat dissipating device, which includes a thermal conductive substance, a plurality of heat-radiating protrusions and a plurality of turbulence-generating structures. The thermal conductive substance has a first surface and a second surface opposite to the first surface. The heat-radiating protrusions are integrally formed with the thermal conductive substance on the first surface. At least one of the turbulence-generating structures is formed on the first surface of the thermal conductive substance in concaved manner and around bottom peripheries of the heat-radiating protrusions, so as to obstruct a development of a boundary layer around the bottom peripheries of the heat-radiating protrusions.

Thus, the instant disclosure has advantages as follows. This present disclosure provides the heat dissipating device, which can obstruct a development of a boundary layer on the first surface of the thermal conductive substance and around the bottom peripheries of the heat-radiating protrusions by the turbulence-generating structures. It can reduce the stationary condition of flow in fluid around the heat-radiating protrusions. Flowing fluid can contact with every part of the heat dissipating device more uniformly, so as to enhance the heat conductive performance and increase heat-dissipating efficiency. The heat dissipating device of this embodiment can reduce some weight because the material of the turbulence-generating structures has been removed. In addition, the structure design of the present disclosure can increase an inflow volume of fluid instead of reducing a flowing space for the flowing fluid.

For further understanding of the instant disclosure, reference is made to the following detailed description illustrating the embodiments and examples of the instant disclosure. The description is for illustrative purpose only and is not intended to limit the scope of the claim.

DETAILED DESCRIPTION OF THE PREFERRED EMBODIMENTS

First Embodiment

Figure 1:
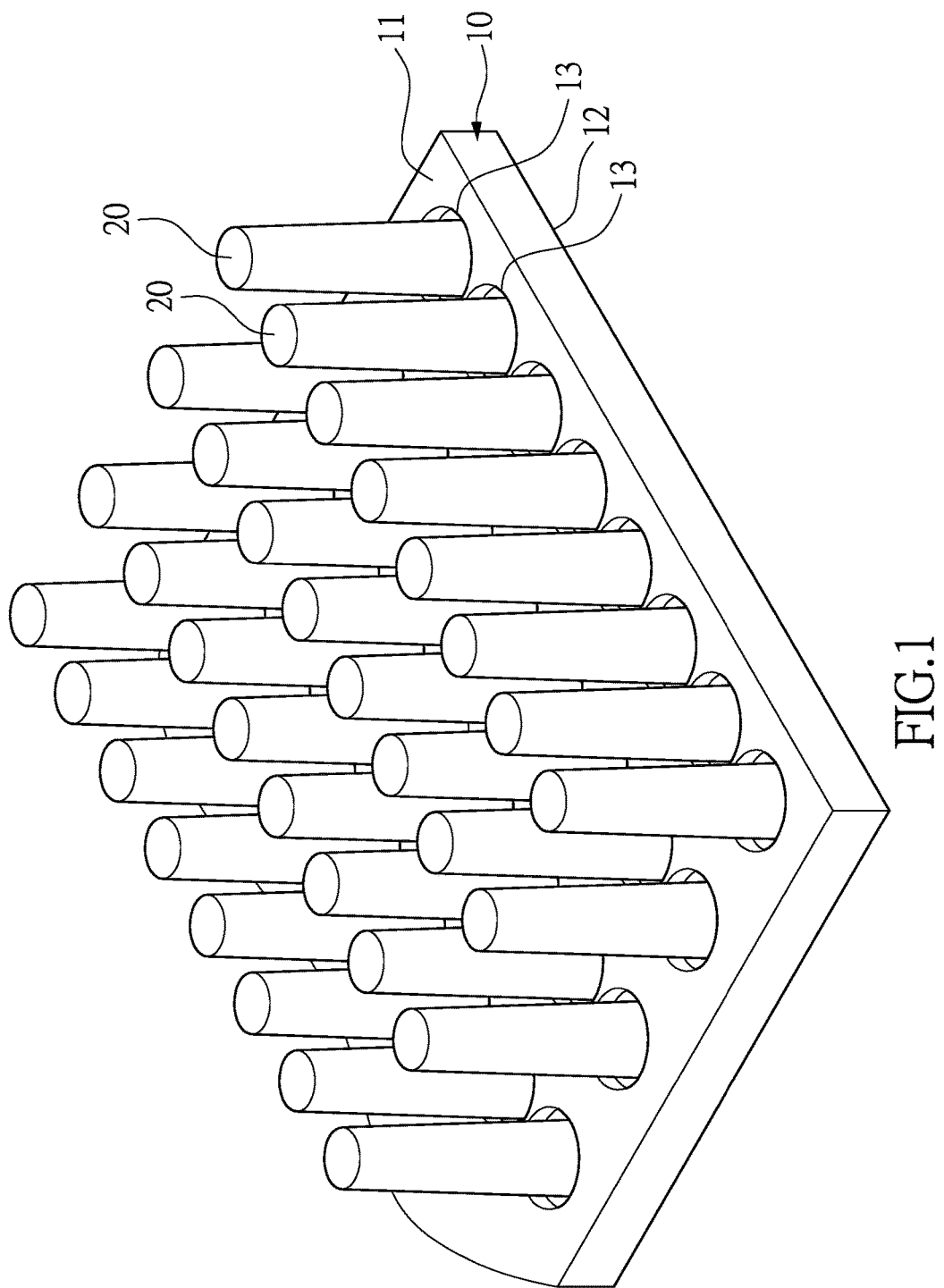
FIG. 1 is a perspective view of a heat dissipating device of first embodiment according to the instant disclosure.

Refer to FIG. 1, which is a perspective view of a heat dissipating device of first embodiment according to the instant disclosure. The instant disclosure provides a thermal conductive substance 10, and a plurality of heat-radiating protrusions 20. The thermal conductive substance 10 has a first surface 11 and a second surface 12 opposite to the first surface 11. The heat-radiating protrusions 20 are integrally formed with the thermal conductive substance 10 and formed on the first surface 11. A plurality of turbulence-generating structures 13 are formed on the first surface 11 of the thermal conductive substance 10 in a concaved manner around the bottom ends of the heat-radiating protrusions 20 correspondingly. Thus, flowing fluid is rotating around the heat-radiating protrusions 20, so that there are vortexes formed in the concaved regions of the turbulence-generating structures 13.

This embodiment has advantages as follows. The turbulence-generating structures 13 can obstruct a development of a boundary layer on the first surface 11 of the thermal conductive substance 10 and around the bottom periphery of the heat-radiating protrusions 20, so that it can reduce the stationary condition of flow fluid around the heat-radiating protrusions 20. Flowing fluid can contact with every part of the heat dissipating device more uniformly, so as to enhance the heat conductive performance and increase heat-dissipating efficiency. In addition, comparing with a conventional heat dissipating device without turbulence-generating structures, the heat dissipating device of this embodiment has another advantage in that it can reduce some weight because the material of the turbulence-generating structures 13 has been removed. Moreover, in such a structure design as that of this embodiment, the concaved turbulence design will not cause a resistance to the flowing fluid, and will not reduce a flowing space for the flowing fluid. This embodiment can increase an inflow volume instead of resulting in a reverse pressure.

To be suitable for flowing fluids of any direction into the heat dissipating device, a preferable embodiment of the present disclosure is that, each of the heat-radiating protrusions 20 has a circular cross-section. Namely, such cross-section is always symmetrical for flowing fluids of different direction. Therefore, no matter which direction of fluid flows to the heat dissipating device, the flow fields of the fluids through the heat-radiating protrusions 20 are identical, and the turbulence-generating structures 13 can function well. Additionally, the heat dissipating device of this embodiment can be mounted more conveniently because there is not any restriction of directionality.

In this embodiment, each of the turbulence-generating structures 13 is formed in a ring shape corresponding to the bottom end of each heat-radiating protrusion 20. The turbulence-generating structures 13 are approximated to each other, but not connected mutually. When the fluid flows through the concave area of each turbulence-generating structure 13, the fluid becomes more chaotic and turbulent. According to this flowing module, the mixture of fluid will be improved more thoroughly, followed with the increase of the numbers of vortexes, and then the effectiveness of thermal conductive is enhanced.

To manufacture this present disclosure, a practical method is that, the heat dissipating device can be made of aluminum, copper, or steel . . . etc. or alloy compound of the above metals, and the technology can be metal injection molding, powder metallurgy casting, metal forging, squeeze casting, or die casting . . . etc. In this embodiment, each of the heat-radiating protrusions 20 is shaped in a substantial conical rod with a draft angle, so that it is more convenient for molding ejection. However, this present disclosure is not limited thereto; for example, the heat-radiating protrusion can be column-shaped.

In an arrangement of the heat dissipating device in this embodiment it is noted that, the heat-radiating protrusions 20 are arranged in a plurality of rows. Odd numbers of the rows of the heat-radiating protrusions 20 and even numbers of the rows of the heat-radiating protrusions 20 are staggered separately away from each other. Therefore, the heat-radiating protrusions 20 can be concentrated more closely. In addition, the fluid flowing around the heat-radiating protrusions 20 approximately to a top end of the heat-radiating protrusion 20, and the nearby row of the heat-radiating protrusions 20 can also obstruct the development of a boundary layer.

Second Embodiment

Figure 2:
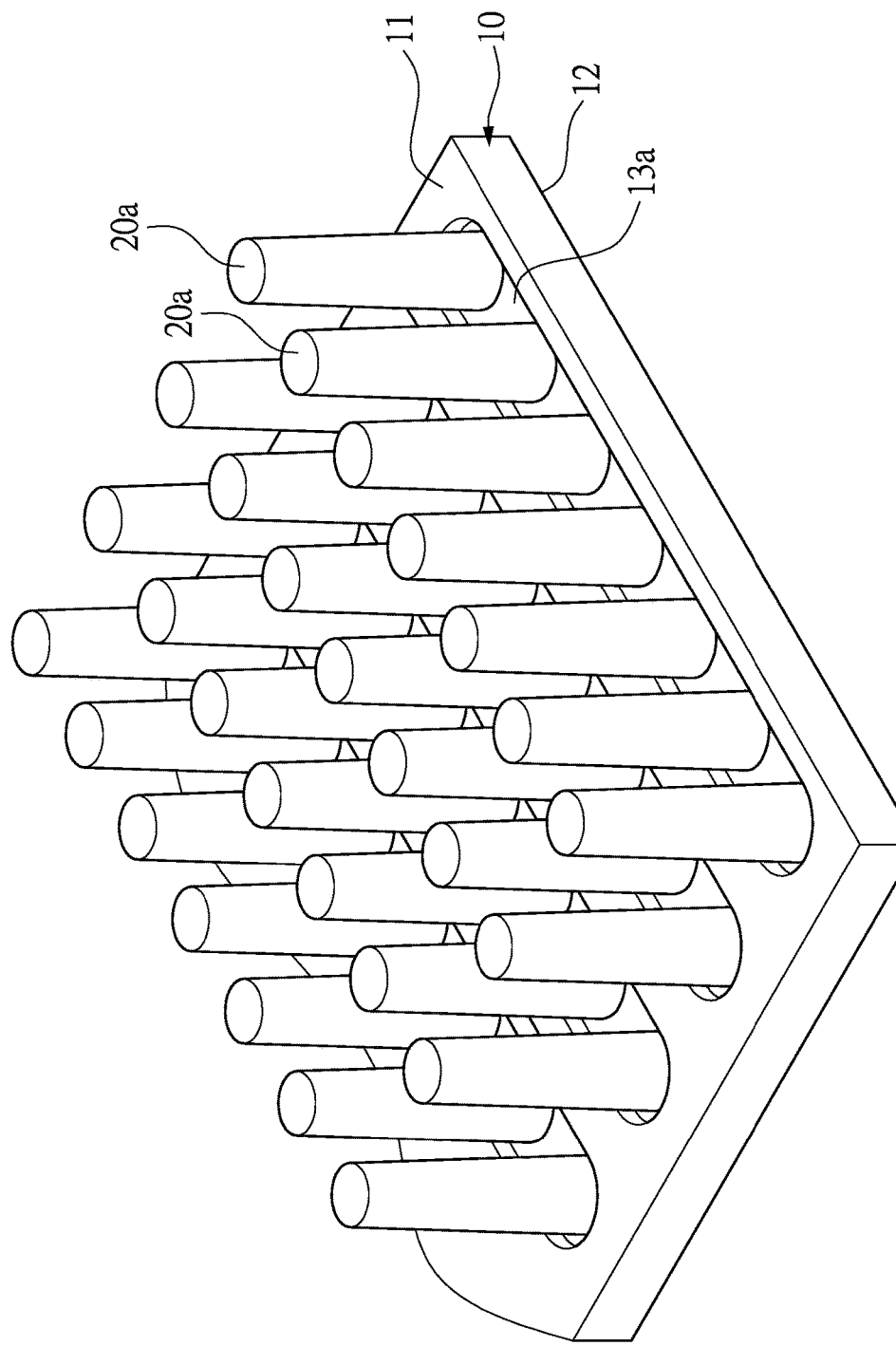
FIG. 2 is a perspective view of a heat dissipating device of second embodiment according to the instant disclosure.

Refer to FIG. 2, which is a perspective view of a heat dissipating device of second embodiment according to the instant disclosure. Different from the above embodiment, the heat dissipating device of this embodiment has a turbulence-generating structure 13a which is concaved and formed in a strip shape, and there is a plurality of parallel rows of turbulence-generating structures 13a. Each of the turbulence-generating structures 13a surrounds the bottom ends of at least two heat-radiating protrusions 20a. In this embodiment, the strip-shaped turbulence-generating structure 13a is extended to two sides of the heat dissipating device, and surrounds seven heat-radiating protrusions 20a.

Third Embodiment

Figure 3:
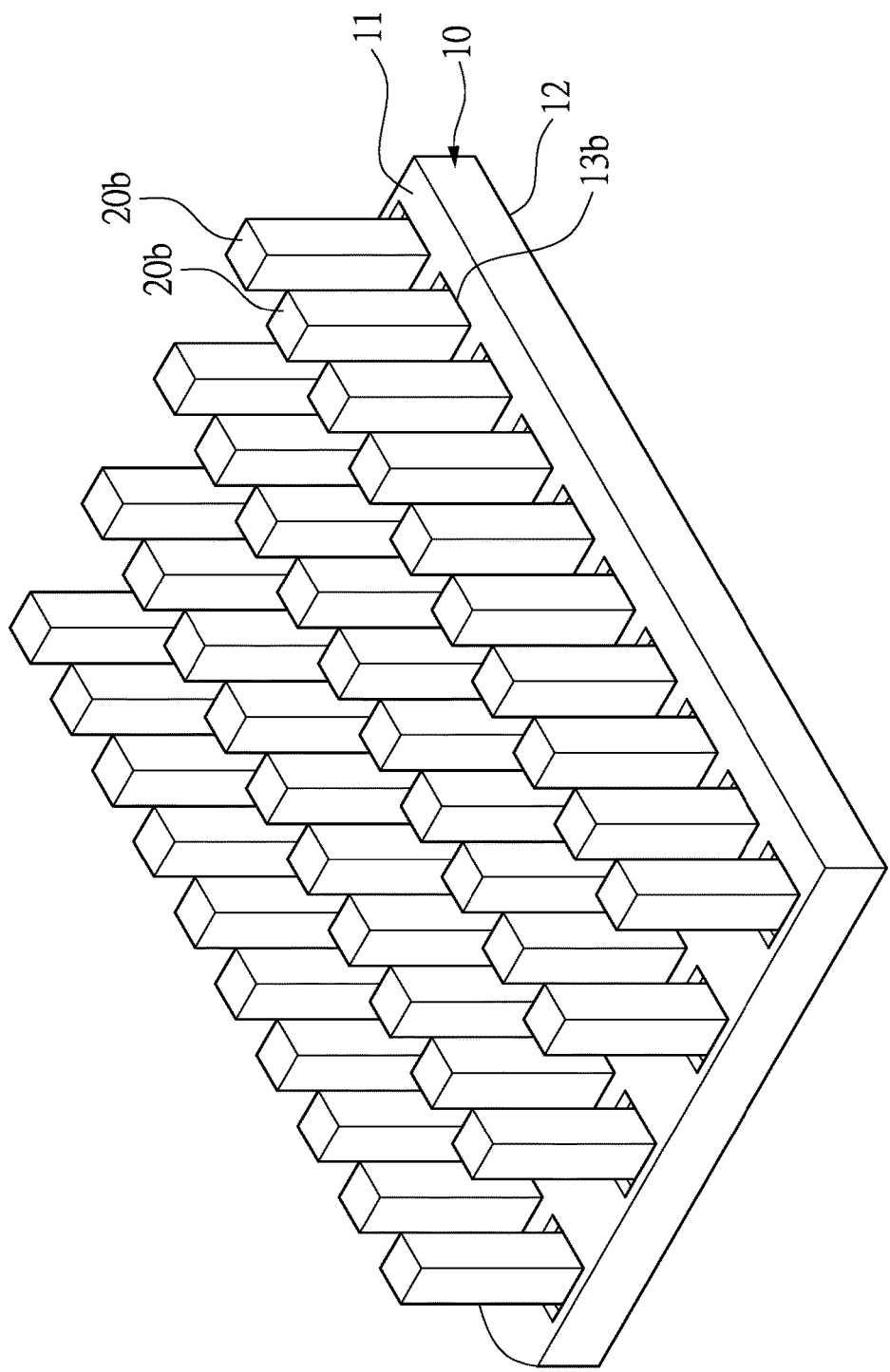
FIG. 3 is a perspective view of a heat dissipating device of third embodiment according to the instant disclosure.

Refer to FIG. 3, which is a perspective view of a heat dissipating device of a third embodiment according to the instant disclosure. Different from the first embodiment, the heat dissipating device of this embodiment has different shaped heat-radiating protrusions. Each heat-radiating protrusion 20b is shaped in a square column, and has a turbulence-generating structure 13b. The turbulence-generating structure 13b is concaved-square-shaped surrounding the bottom end of the heat-radiating protrusion 20b.

Fourth Embodiment

Figure 4:
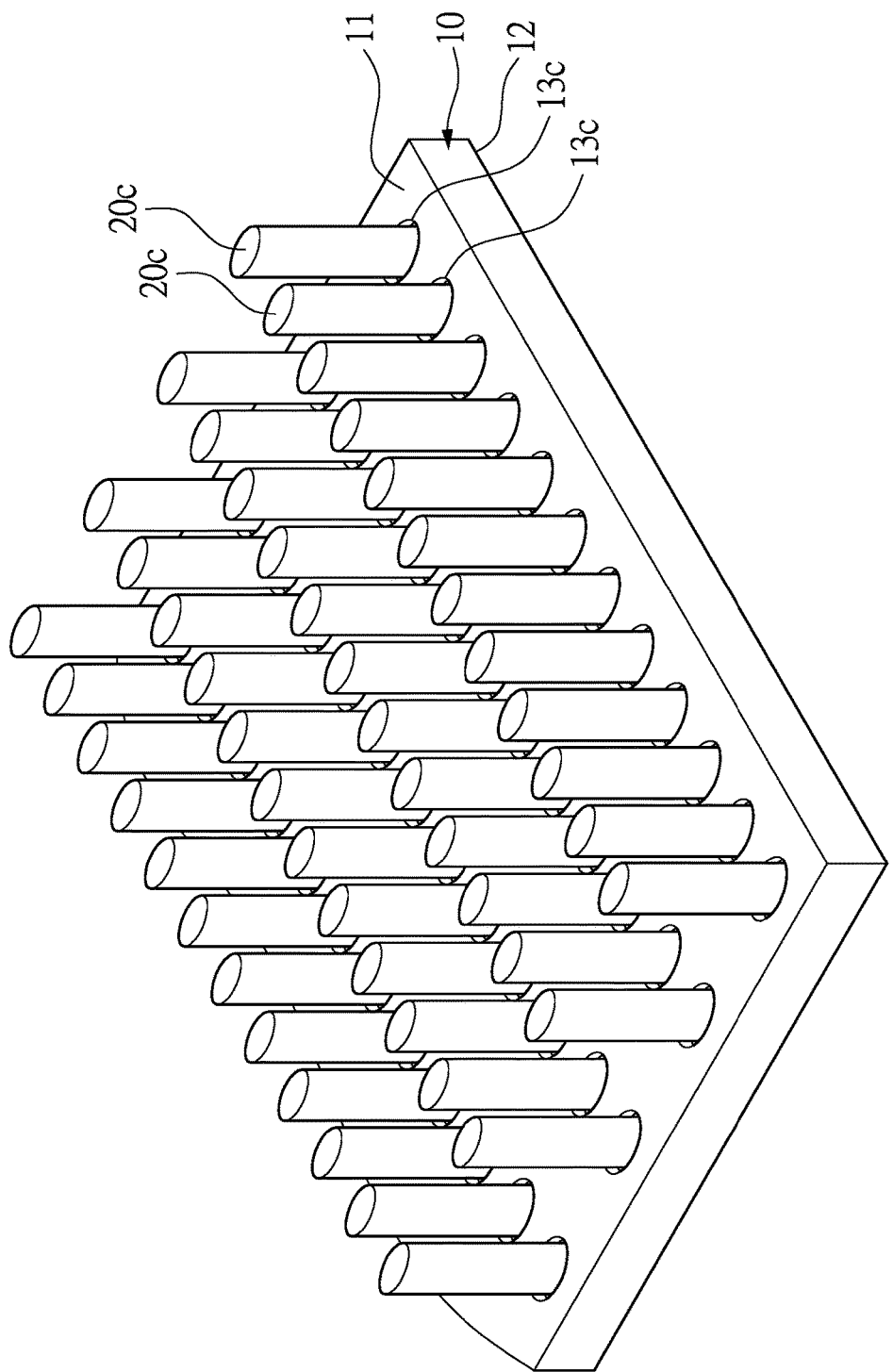
FIG. 4 is a perspective view of a heat dissipating device of fourth embodiment according to the instant disclosure.

Refer to FIG. 4, which is a perspective view of a heat dissipating device of fourth embodiment according to the instant disclosure. Different from the first embodiment, the heat dissipating device of this embodiment has different shaped heat-radiating protrusions. Each heat-radiating protrusion 20c is shaped as an elliptical column, and has a turbulence-generating structure 13c. The turbulence-generating structure 13c is shaped in a concave elliptical column, surrounding the bottom end of the heat-radiating protrusion 20c.

Fifth Embodiment

Figure 5:
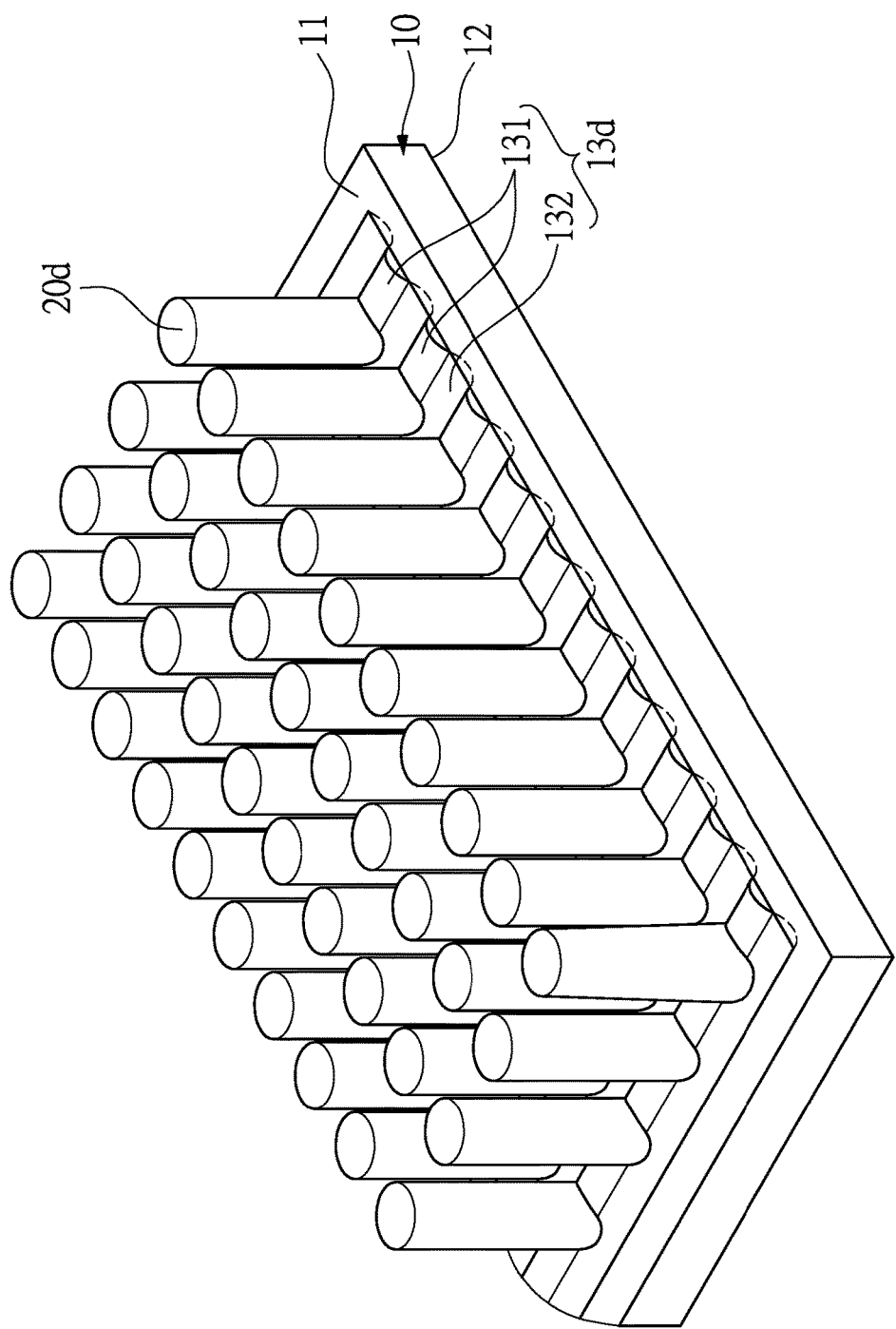
FIG. 5 is a perspective view of a heat dissipating device of fifth embodiment according to the instant disclosure.

Refer to FIG. 5, which is a perspective view of a heat dissipating device of fifth embodiment according to the instant disclosure. Different from the above embodiments, turbulence-generating structure of this embodiment is not only concaved from the thermal conductive substance 10, but also protruded from the thermal conductive substance 10. In this embodiment, the turbulence-generating structures 13d are wavy-shaped, and have a part protruded outside the first surface 11 of the thermal conductive substance 10, and a part concaved downward from the first surface 11 of the thermal conductive substance 10. The turbulence-generating structure 13d has a plurality of peak-type turbulators 131 and a plurality of concave-type turbulators 132. The peak-type turbulators 131 are protruded beyond the first surface 11 of the thermal conductive substance 10. The concave-type turbulators 132 are concaved downward from the first surface 11 of the thermal conductive substance 10. The peak-type turbulators 131 and the concave-type turbulators 132 are extended linearly along the first surface, and parallel to each other. The heat-radiating protrusion 20d can be connected to the peak-type turbulator 131, and the bottom end of the heat-radiating protrusion 20d partially extends to the concave-type turbulator 132. Such design of the turbulence-generating structure 13d can generate turbulence not only above the first surface 11 of the thermal conductive substance 10, but also under the first surface 11 of the thermal conductive substance 10.

The description above only illustrates specific embodiments and examples of the instant disclosure. The instant disclosure should therefore cover various modifications and variations made to the herein-described structure and operations of the instant disclosure, provided they fall within the scope of the instant disclosure as defined in the following appended claims.

What is claimed is:

1. A heat dissipating device, comprising:
a thermal conductive substance, having a first surface and a second surface opposite to the first surface;
a plurality of heat-radiating protrusions, integrally formed with the thermal conductive substance on the first surface, each of the heat-radiating protrusions being solid; and
a plurality of turbulence-generating structures, each of the heat-radiating protrusions having one of the turbulence-generating structures, each of the turbulence-generating structures being formed on the first surface of the thermal conductive substance in concaved manner and around bottom peripheries of the heat-radiating protrusions, so as to obstruct a development of a boundary layer around the bottom peripheries of the heat-radiating protrusions;

each of the turbulence-generating structures is ring-shaped and concavely surrounds around a bottom periphery of each of the heat-radiating protrusions, respectively;

wherein the turbulence-generating structures are independently separated from each other without communication.

2. The heat dissipating device as claimed in claim 1, wherein each of the heat-radiating protrusions has a cross-sectional surface in a symmetrical shape for producing flow fields of different flow directions symmetrically.

3. The heat dissipating device as claimed in claim 2, wherein each of the heat-radiating protrusions is column-shaped.

4. The heat dissipating device as claimed in claim 2, wherein the heat-radiating protrusions are arranged in rows, odd numbers of the rows of the heat-radiating protrusions and even numbers of the rows of the heat-radiating protrusions are staggered separately away from each other.

5. The heat dissipating device as claimed in claim 2, wherein each of the turbulence-generating structures surrounds the bottom of at least two of the heat-radiating protrusions.

6. The heat dissipating device as claimed in claim 1, wherein the turbulence-generating structures are wavy-shaped, and have a part protruded outside the first surface of the thermal conductive substance, and a part concaved downward from the first surface of the thermal conductive substance.

7. The heat dissipating device as claimed in claim 6, wherein the turbulence-generating structure has a plurality of peak-type turbulators and a plurality of concave-type turbulators, wherein the peak-type turbulators are protruded beyond the first surface of the thermal conductive substance, the concave-type turbulators are concaved downward from the first surface of the thermal conductive substance.

8. The heat dissipating device as claimed in claim 7, wherein the peak-type turbulators and the concave-type turbulators are extended linearly along the first surface, and parallel to each other.

* * * * *